United States Patent [19]

Kimura

[11] Patent Number: 5,396,076
[45] Date of Patent: Mar. 7, 1995

[54] ION IMPLANTATION SYSTEM WITH PROTECTIVE PLATES OF SILICON IN MASS ANALYZING REGION

[75] Inventor: Hideki Kimura, Kanagawa, Japan

[73] Assignee: Sony Corporation, Tokyo, Japan

[21] Appl. No.: 61,308

[22] Filed: May 14, 1993

[30] Foreign Application Priority Data

May 21, 1992 [JP] Japan .................................. 4-128372

[51] Int. Cl.⁶ .............................................. H01J 37/00
[52] U.S. Cl. ............................. 250/492.21; 250/492.2
[58] Field of Search ......................... 250/492.2, 492.21

[56] References Cited

U.S. PATENT DOCUMENTS 5,134,301  7/1992  Kamata et al. .................. 250/492.21

*Primary Examiner*—Jack I. Berman
*Assistant Examiner*—James Beyer
*Attorney, Agent, or Firm*—Hill, Steadman & Simpson

[57] ABSTRACT

An ion implantation system composed of an ion source to generate ion beam, a mass analyzing region to select ions having a predetermined mass from the ion beam, an acceleration region to accelerate the ion beam selected, scanning regions to respectively scan the ion beam toward the X and Y directions, and protecting means located along the exposed surface of the inner wall of the mass analyzing region. The protecting means may be formed of a thin silicon plate, and located to cover the inner wall of the mass analyzing region. Preferably, the silicon plate is located at an upper and a lower portion of an exposed surface of the inner wall of the mass analyzing region. The protecting means may be formed of plurality of silicon plates that can be disassembled.

2 Claims, 5 Drawing Sheets

ION IMPLANTATION SYSTEM WITH PROTECTIVE PLATES OF SILICON IN MASS ANALYZING REGION

BACKGROUND OF THE INVENTION

1. Field of the Invention

The present invention relates generally to an ion implantation system. Specifically, the present invention relates to an ion implantation system to minimize metal contamination of a semiconductor wafer prepared thereby.

2. Description of the Background Art

Generally, an ion implantation system is composed of an ion source, an ion drawing out region, a mass analyzing region, an acceleration region, and a scanning(convergence/deflection) region. A vacuum vessel defines a path of ion beam drawn out from the ion source to an end station where a silicon wafer to be deposited is installed. A Faraday gauge and an acceleration electrode are installed downstream of the scanning region. Plurality of apertures are installed at plurality of portions of the system. In the vacuum vessel, a beamline and a chamber of the mass analyzing region, which occupies most of the vessel, are formed of stainless steel materials, such as Fe, Cr and Ni. The Faraday gauge and the acceleration electrode are formed of aluminum (Al). The apertures, the scanning region and a lens electrode are formed of graphite. When the silicon wafer is ion implanted using such ion implantation system, inner wall of the beamline through which the beam passes are sputtered by ions. Therefore, metals, e.g., Fe, Cr and Al, are brought into the silicon wafer.

FIGS. 1 and 2 are graphs showing a relationship between the depth of the wafer and ion concentration when arsenic (As) ions were implanted into the silicon wafer under the conditions of 70 keV, 1e17 using the aforementioned ion implantation system. Measurement is done by secondary ion mass spectrometry (SIMS). FIG. 1 shows contamination level of the wafer by Cr and Al, on the other hand, FIG. 2 shows that by Fe. As sown in the figures, 14 ppm of chromium (Cr), 4.9 ppm of Al, and 27 ppm of iron (Fe) is respectively contaminated in the wafer against the amount of implanted As ions. Such levels of metal contamination in the wafer increases leakage current of MOS transistor formed on the wafer.

Alternatively, an ion implantation system including a plurality of protection boards (apertures) to protect passing of metals sputtered is disclosed in Extended Abstracts of the 1991 International Conference of Solid State Devices and Materials, Yokohama, 1991, pp. 565-567.

Referring to FIG. 8 showing such ion implantation system, a plurality of protection boards 1 and 2 formed of silicon are installed downstream of a scanning region 3 of the Y direction and downstream of a scanning region 4 of the X direction to protect passing sputtered metals. Numeral 5 designates a silicon wafer. When the ion beam is directed toward the wafer with diverging ions (repulsing of ions from each other), the ion beam sputters the wall of the beamline upstream of the protection boards 1 and 2. However, most particles of metals, such as Fe and Cr, generated by sputtering are protected by the protection boards 1 and 2. Therefore, very few metal particles can reach the wafer because the ion beam travels a long distance along the beamline toward the wall while the width of the ion beam is relatively narrow.

Additionally, it has been proposed that materials used in the construction of the system be mostly replaced with silicon parts. Though this is very effective to perfectly eliminate metal contamination, the cost for manufacturing becomes great. Additionally, durability of the system is deteriorated if all parts are replaced with silicon parts.

SUMMARY OF THE INVENTION

It is therefore a principal object of the present invention to provide an ion implantation system which can minimize metal contamination brought into a wafer.

It is another object of the present invention to provide an ion implantation system which can reduce manufacturing cost.

It is a further object of the present invention to provide an ion implantation system having sufficient durability.

According to one aspect of the present invention, an ion implantation system is composed of an ion source to generate an ion beam, a mass analyzing region to select ions having a predetermined mass from the ion beam, an acceleration region to accelerate the ion beam selected, scanning regions to respectively scan the ion beam toward the X and Y directions, and protecting means located along the exposed surface of the inner wall of the mass analyzing region.

The protecting means may be formed of a thinned silicon plate, and located to cover the inner wall of the mass analyzing region. Preferably, the silicon plate is located at an upper and a lower portion of the exposed surface of the inner wall of the mass analyzing region.

The protecting means may be formed of a plurality of silicon plates that can be disassembled.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENT

Firstly, the inventor of the present invention has studied to find an area mostly affected by sputtering of ion beam in a typical ion implantation system. Generally, a pair of analyzing magnets are located at upper and lower portions of a mass analyzing region of the system in opposed relationships. The distance of the magnets is determined to be approximately 25 mm, which is less than 1/10 of that of other parts of a beamline to maintain magnetic field generated by the magnets uniformly. Therefore, an ion beam diverged and drawn out from an ion source severely sputters the inner wall of the mass analyzing region to generate a great amount of diffused particles of metals, such as Fe, Cr and Ni. A partial amount thereof reaches a wafer through an acceleration tube via analyzing magnetic field. Thus, it has been found that sputtering of the inner wall of the system mostly occurs at the mass analyzing region of a typical ion implantation system. Portions adjacent both magnets are the most sputtered. Therefore, the present invention seeks to protect the analyzing region of the implantation system, especially, to protect the portions adjacent the magnets.

Figure 4:
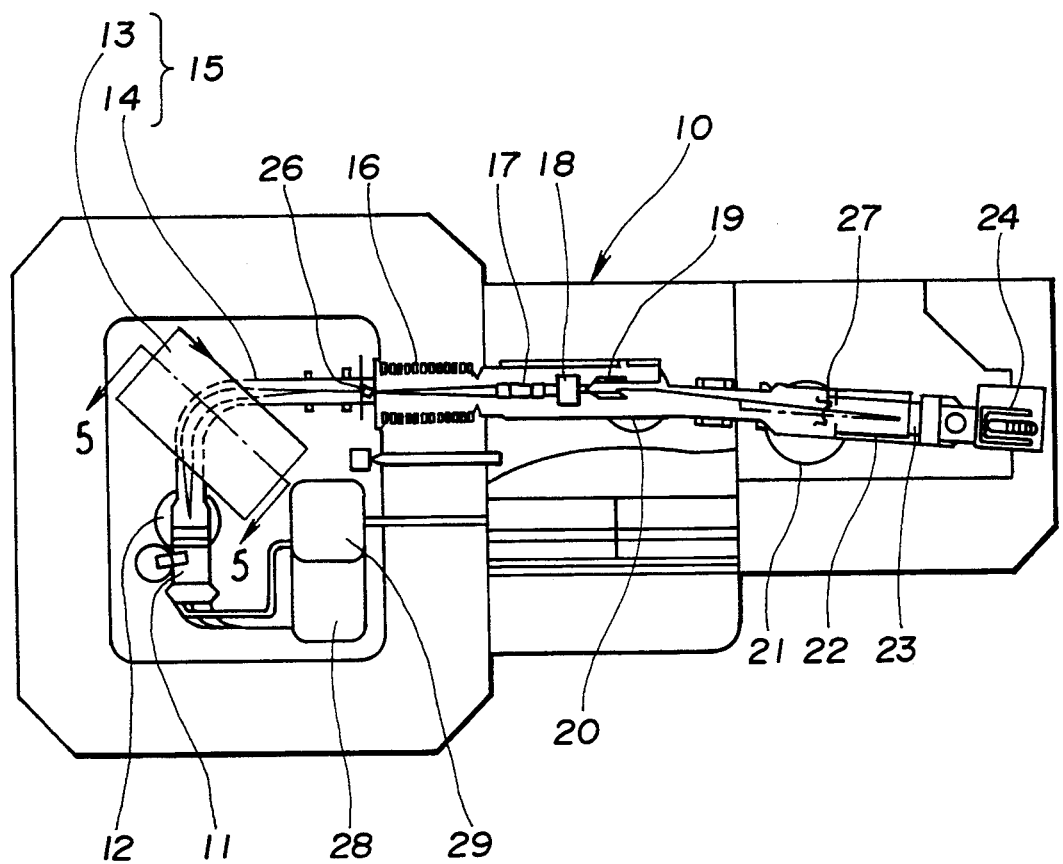
FIG. 4 is a plan view of an ion implantation system according to the present invention.

Referring now to FIG. 4, an ion implantation system 10 preferably is composed of an ion source 11, a diffusion pump 12 to draw out ions from the ion source 11, a mass analyzing region 15 to select ions having predetermined mass from ion beam which is drawn out from the diffusion pump 12, an acceleration region 16 to accelerate ion beam selected by the mass analyzing region 15, a lens electrode 17, a Y direction scanning electrode 18, an X direction scanning electrode 19, other diffusion pumps 20 and 21, and a Faraday gauge 22. A wafer 23 formed of silicon and a feeder 24 are installed at an end station of the system 10. An aperture 26 is installed upstream of the acceleration region 16, and an aperture 27 is installed downstream of the diffusion pump 21. Numeral 28 designates power supply and 29 designates a gas source.

Figure 5:
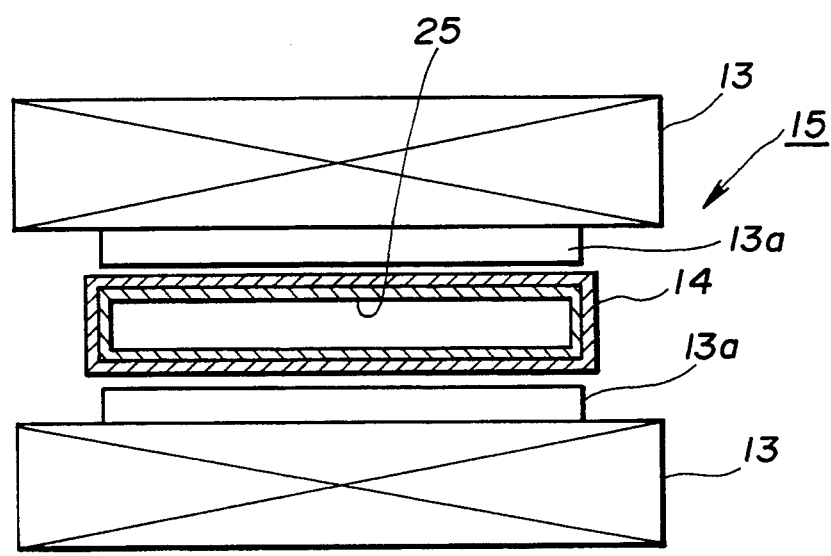
FIG. 5 is a cross-sectional view taken generally along the line A—A of FIG. 4.

Referring now to FIG. 5, the mass analyzing region 15 which selects ions having the predetermined mass, is composed of a pair of analyzing magnets 13 located at an upper and lower portion of the mass analyzing region 15, respectively, each having a magnet core 13a on a surface thereof facing a chamber 14, which chamber 14 is to analyze the ion beam passed therethrough. The inner wall of the chamber 14 is covered with a thinned silicon plate 25. Preferably the portions of the chamber 14 contacting the upper and lower magnets 13 are covered with the silicon plate 25.

In the ion implantation system of the present invention, an ion beam drawn out from the ion source 11 by the diffusion pump 12 is diffused similar as the system of the prior art, then comes into collision with the inner wall of the chamber 14 in the mass analyzing region 15. However, metal sputtering at the chamber 14 is protected by the silicon plate 25. If the silicon of the silicon plate 25 is sputtered and brought into the silicon wafer 23, silicon contamination in the wafer 23 is negligible as compared to the metal contamination previously mentioned.

Figure 1:
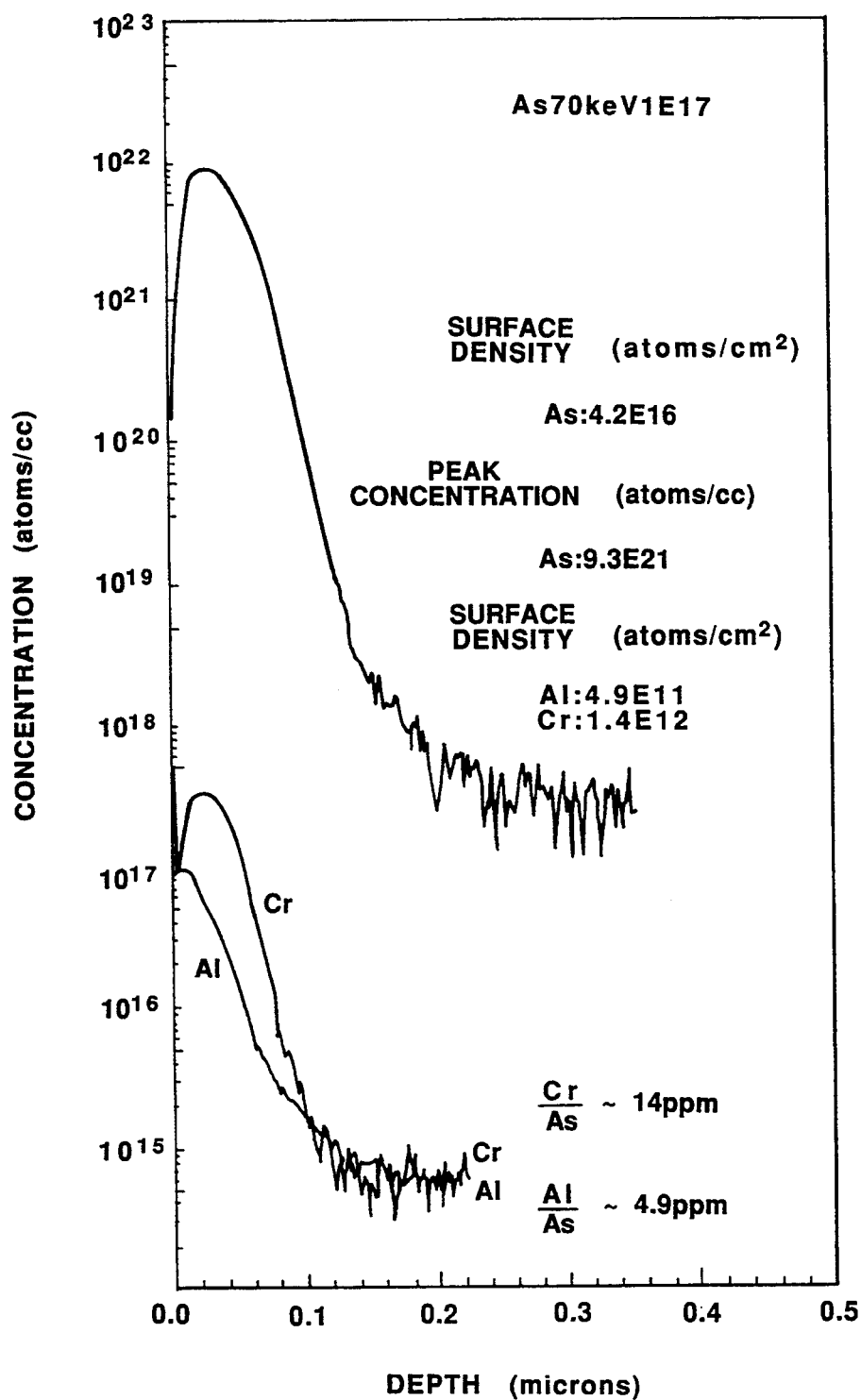
FIGS. 1 and 2 are graphs that illustrate a relationship between the depth of a silicon wafer and ion concentration when arsenic (As) ions are implanted into the wafer using an ion implantation system according to prior art.
Figure 2:
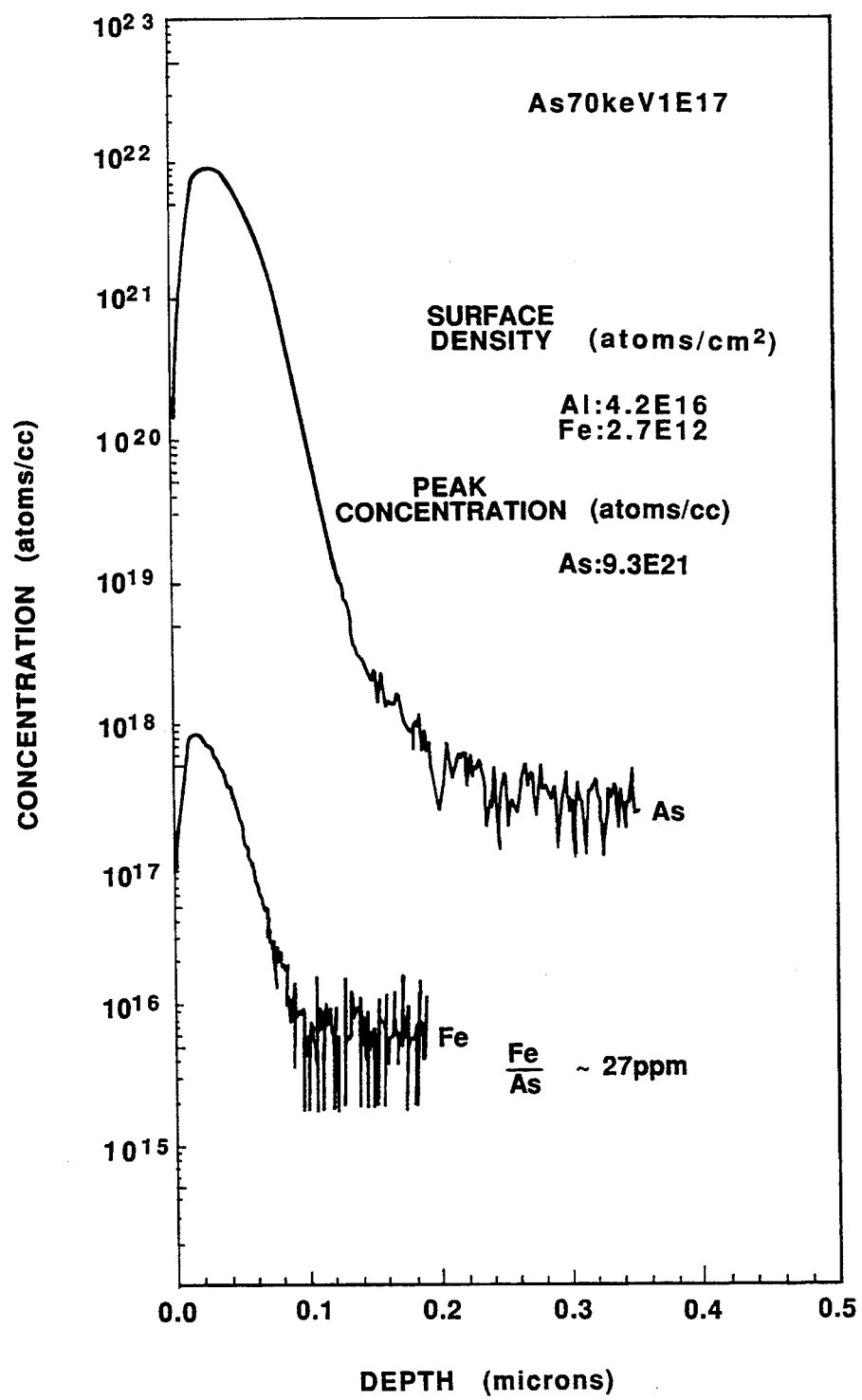
Figure 3:
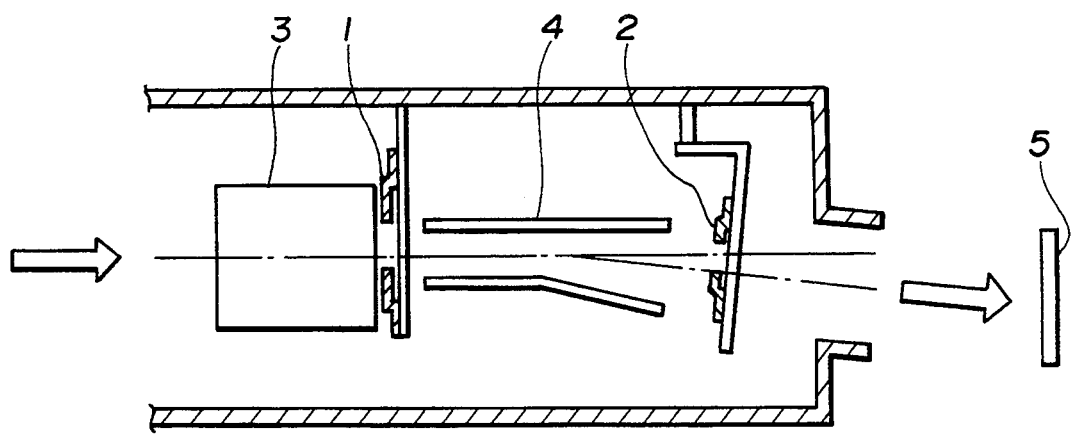
FIG. 3 is a cross-sectional view of a beamline in which plurality of protection boards are installed according to prior art.

The silicon plate 25 may be cylindrically formed, however, it is not limited to a particular structure, as it may be formed so that it can be disassembled and available to re-assemble in the chamber 14. This is especially preferred for the usage in the chamber 14 having a curved construction as shown in FIG. 1. Alternatively, the chamber 14 may be disassembled and re-assembled after the silicon plate 25 is installed on the inner wall of the chamber 14. The silicon plate 25 may be exchangeably formed so as to be periodically exchanged to maintain the system.

According to the present invention, the inner wall of the mass analyzing region which suffers the most from ion beam divergence caused metal contamination is covered with a plate of silicon. Therefore, compared to the prior system described above, the ion implantation system of the present invention can significantly reduce manufacturing cost. Metal contamination of the wafer can be sufficiently minimized by the silicon plate of the present invention. Therefore, characteristics of a semiconductor device formed on the wafer can be enhanced. For example, leakage current of MOS transistor can be reduced, or LSI having minimized demand can be manufactured.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the inventions as set forth in the appended claims.

What is claimed is:

1. An ion implantation system comprising:
   an ion source to generate an ion beam,
   a mass analyzing region to selectively remove ions having a predetermined mass from said ion beam,
   an acceleration region to accelerate said ion beam after said selected ions have been removed,
   scanning regions to respectively scan said ion beam toward the X and Y directions, and
   protecting means located along an exposed surface of the inner wall of said mass analyzing region, said protecting means being formed of at least one thin plate of silicon, said at least one of plate of silicon being located to cover the inner wall of said mass analyzing region, said at least one plate of silicon being located at an upper portion and a lower portion of said inner wall of said mass analyzing region.

2. An ion implantation system as set forth in claim 1, wherein said protecting means is formed of a singular silicon plate formed as a tubular member that lines an inner surface of the mass analyzing region.

* * * * *